United States Patent
Soman et al.

(10) Patent No.: US 9,830,405 B2
(45) Date of Patent: Nov. 28, 2017

(54) SYSTEM AND METHOD FOR PROVIDING SKETCH DIMENSIONS FOR A DRAWING VIEW

(71) Applicant: Siemens Product Lifecycle Management Software Inc., Plano, TX (US)

(72) Inventors: Shrinivas Soman, Cypress, CA (US); Nilesh Gurav, Pune (IN); Arindam Ghosh, Pune (IN); Manish Anand, Pune (IN)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 674 days.

(21) Appl. No.: 14/257,660

(22) Filed: Apr. 21, 2014

(65) Prior Publication Data

US 2014/0358493 A1    Dec. 4, 2014

(30) Foreign Application Priority Data

May 29, 2013   (IN) .............................. 624/KOL/2013

(51) Int. Cl.
*G06F 17/50*    (2006.01)
*G06T 19/00*    (2011.01)

(52) U.S. Cl.
CPC .............. *G06F 17/50* (2013.01); *G06T 19/00* (2013.01); *G06T 2219/012* (2013.01)

(58) Field of Classification Search
CPC ...... G06F 17/50; G06T 19/00; G06T 2219/01
See application file for complete search history.

(56) References Cited

U.S. PATENT DOCUMENTS

| | | | |
|---|---|---|---|
| 5,467,293 A | | 11/1995 | Summer et al. |
| 5,771,342 A | * | 6/1998 | Todd ........................ G06T 17/00 345/660 |
| 6,654,027 B1 | * | 11/2003 | Hernandez .............. G06T 19/00 345/581 |

(Continued)

FOREIGN PATENT DOCUMENTS

| | | |
|---|---|---|
| JP | H11120385 A | 4/1999 |
| JP | 2003330972 A | 11/2003 |

(Continued)

OTHER PUBLICATIONS

Pratt et al., "Towards the standardized exchange of parameterized feature-based CAD models" (2005), Elsevier Ltd., Computer-Aided Design 37, 1251-1265.*

(Continued)

*Primary Examiner* — Kamini S Shah
*Assistant Examiner* — Steven Crabb

(57) ABSTRACT

Methods for providing sketch dimensions for a drawing view and corresponding systems and computer-readable mediums. A method includes receiving a geometric model including a revolved feature generated using a sketch having sketch dimensions. The sketch and the sketch dimensions are in a sketch plane. The method includes, in response to one or more sketch objects being visible in a current view plane of the revolved feature, generating a drawing view of the one or more sketch objects in the current view plane. The drawing view includes the sketch dimensions of the one or more sketch objects.

14 Claims, 7 Drawing Sheets

(56) References Cited

U.S. PATENT DOCUMENTS

| | | | |
|---|---|---|---|
| 2001/0018644 A1* | 8/2001 | Schwalb | G06T 19/00 703/7 |
| 2002/0089499 A1* | 7/2002 | Lee | G06T 17/005 345/419 |
| 2002/0118229 A1* | 8/2002 | Batori | G06T 19/00 715/771 |
| 2003/0071810 A1* | 4/2003 | Shoov | G06F 17/50 345/420 |
| 2003/0182090 A1* | 9/2003 | Paladini | G06F 17/50 703/1 |
| 2003/0210244 A1* | 11/2003 | Sasago | G06T 19/00 345/419 |
| 2004/0019264 A1* | 1/2004 | Suurmond | G06T 19/00 600/407 |
| 2004/0153824 A1 | 8/2004 | Devarajan et al. | |
| 2004/0177089 A1* | 9/2004 | Love | G06F 17/30271 |
| 2009/0189887 A1 | 7/2009 | Teemu et al. | |
| 2010/0201684 A1 | 8/2010 | Yadav et al. | |
| 2013/0097489 A1 | 4/2013 | Linder et al. | |
| 2015/0332511 A1* | 11/2015 | Jovanovic | G06T 15/20 345/427 |

FOREIGN PATENT DOCUMENTS

| | | |
|---|---|---|
| JP | 2006048569 A | 2/2006 |
| JP | 2006092143 A | 4/2006 |

OTHER PUBLICATIONS

Kim et al., "Standardized data exchange of CAD models with design intent" (2008), Elsevier Ltd., Computer-Aided Design 40, 760-777.*

PCT Search Report dated Sep. 17, 2014, for PCT application No. PCT/US2014/039177. (13 pages).

EP Search Report dated Jul. 19, 2016, for EP Application No. 14804531.3, 6 pages.

* cited by examiner

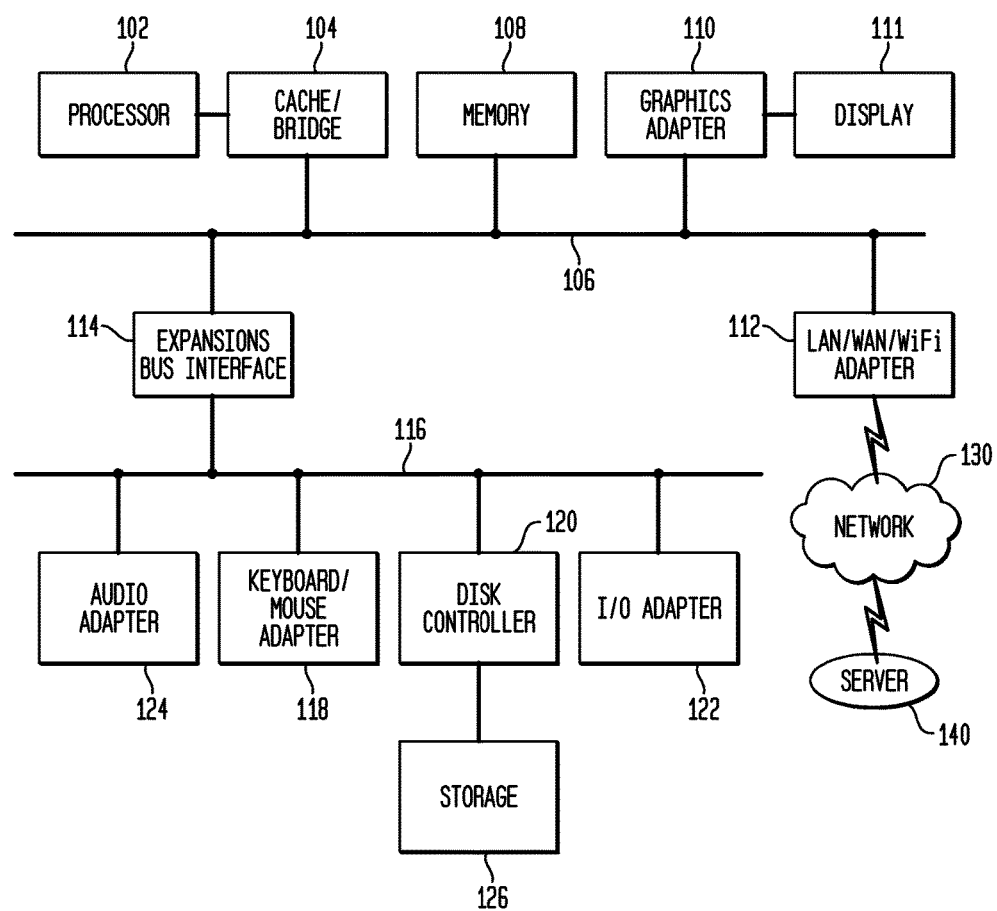

SYSTEM AND METHOD FOR PROVIDING SKETCH DIMENSIONS FOR A DRAWING VIEW

RELATED APPLICATION

This patent document claims priority under 35 U.S.C. §119 and all other benefits from Indian Patent Application Serial No. 624/KOL/2013, filed May 29, 2013, titled: "System and Method For Providing Sketch Dimensions For a Drawing View," the content of which is hereby incorporated by reference to the extent permitted by law.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include methods for providing sketch dimensions for a drawing view and corresponding systems and computer-readable mediums. A method includes receiving a geometric model including a revolved feature generated using a sketch having sketch dimensions. The sketch and the sketch dimensions are in a sketch plane. The method includes, in response to one or more sketch objects being visible in a current view plane of the revolved modeling feature, generating a drawing view of the one or more sketch objects in the current view plane. The drawing view includes the sketch dimensions of the one or more sketch objects.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 1 illustrates a block diagram of a data processing system in which an embodiment can be implemented;

DETAILED DESCRIPTION

Figure 2A:
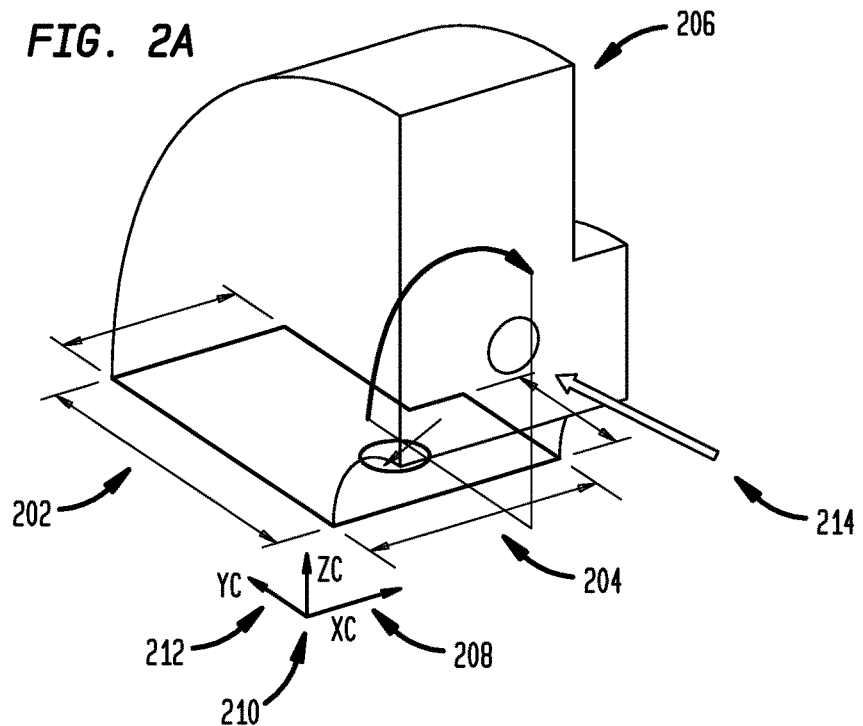
FIGS. 2A-2B illustrate examples of a sketch having sketch dimensions, a revolved modeling feature generated using the sketch, and a drawing view where the sketch dimensions are not "inherited" into the drawing view.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Sketches that include dimensions of objects are often used to generate revolved modeling features. The sketches are created in a plane. For these revolved modeling features, any plane about an axis of revolution may be used to generate a drawing view. Such a plane may not be parallel to the sketch plane, but users may wish to generate the drawing view based on the plane and "inherit" product and manufacturing information (PMI) sketch dimensions in the drawing view as well as document other model geometry. Disclosed embodiments provide systems and methods to enable users to inherit sketch dimensions into a drawing view that is not parallel to the sketch plane, where the sketch dimensions are correctly oriented in the drawing view.

FIG. 1 depicts a block diagram of a data processing system in which an embodiment can be implemented, for example as a PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments provide systems and methods to enable users to inherit sketch dimensions from a sketch in a sketch plane into a drawing view that is not parallel to the sketch plane. The sketch dimensions are correctly oriented in the drawing view. Techniques and processes described herein can be performed on models developed on the PDM system or imported from another system.

Figure 2B:
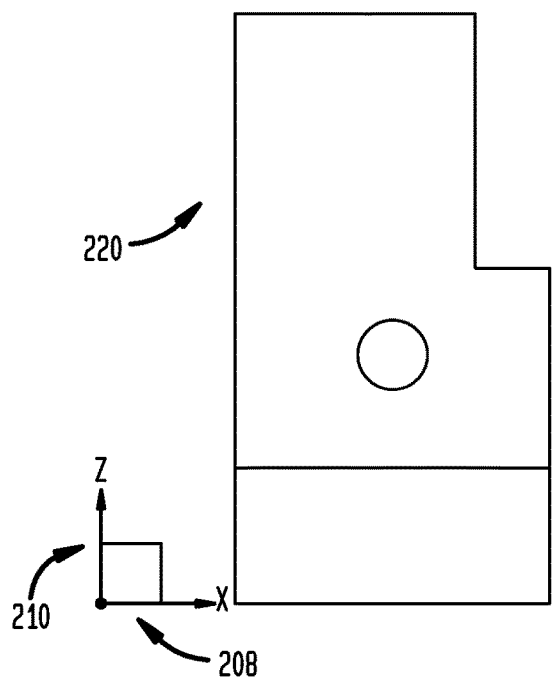

FIGS. 2A-2B illustrate examples of a sketch having sketch dimensions, a revolved modeling feature generated using the sketch, and a drawing view where the sketch dimensions are not "inherited" into the drawing view.

FIG. 2A illustrates a sketch 202 that includes sketch dimensions 204 of objects, such as edges, holes, etc. The sketch 202 is generated in a sketch plane and may be used to generate a revolved modeling feature 206. For example, the sketch 202 and its dimensions 204 may be generated in an XY plane defined by an X-axis 208 and a Y-axis 212. The sketch 202 may be rotated about the X-axis 208 to generate the revolved modeling feature 206. In the particular embodiment illustrated in FIG. 2A, the sketch 202 is rotated 90 degrees about the X-axis 208 to generate the revolved modeling feature 206. Although illustrated as being rotated 90 degrees about the X-axis 208, the sketch 202 may be rotated other degree amounts as well. In other embodiments, the sketch 202 may be rotated about other axes, such as the Y-axis 212.

A need may arise to show the sketch dimensions 204 in a drawing view 220. The drawing view 220 may be associated with a current view plane of the revolved modeling feature 206. For example, the current view plane may represent a view direction 214 of the revolved modeling feature 206 in a particular orientation from the perspective of a user. As illustrated in FIG. 2B, the drawing view 220 may be generated in a plane defined by the X-axis 208 and a Z-axis 210 (e.g., an XZ plane). In the illustrated example, the sketch dimensions 204 of FIG. 2A are not "inherited" into the drawing view 220 and instead would need to be manually re-created because an orientation of the sketch plane is non-parallel with an orientation of the drawing view 220. For example, a determination whether an orientation of the sketch plane is parallel to an orientation of the drawing view may be made by comparing a normal to the sketch plane (i.e., the Z-axis in the illustrated embodiment) and a normal to an orientation of the drawing view (i.e., the Y-axis in the illustrated embodiment). In the illustrated embodiment of FIGS. 2A-2B, the normal to the sketch plane and the normal to the current view plane are not parallel to each other. Thus the sketch dimensions 204 would not be oriented correctly in the drawing view 220 and are not inherited into the drawing view 220. Instead, the sketch dimensions 204 would need to be manually re-created in the drawing view 220.

Figure 3A:
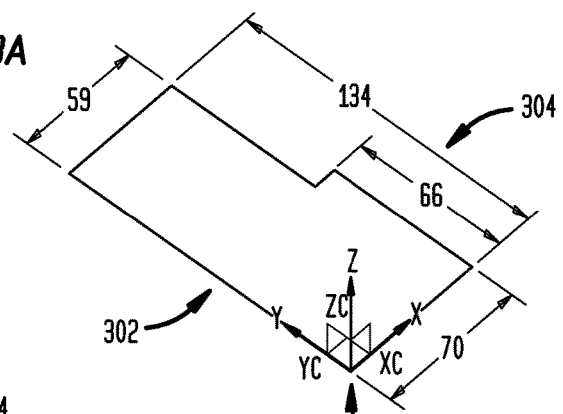
FIGS. 3A-3C illustrate examples of a sketch having sketch dimensions, a revolved modeling feature generated using the sketch, and a drawing view where the sketch dimensions are "inherited" into the drawing view.
Figure 3B:
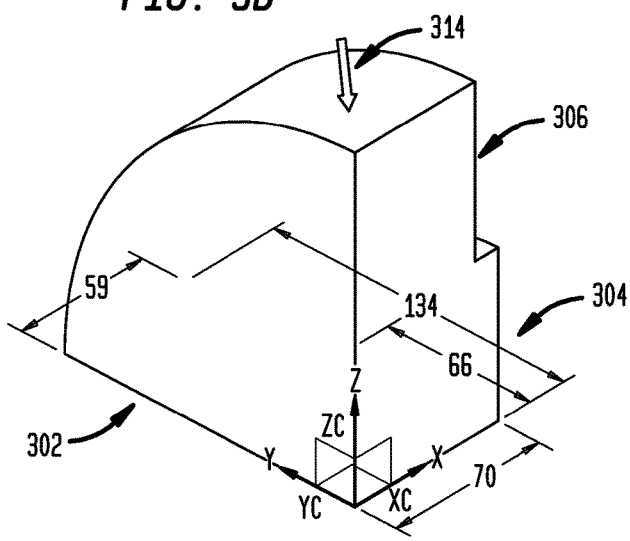
Figure 3C:
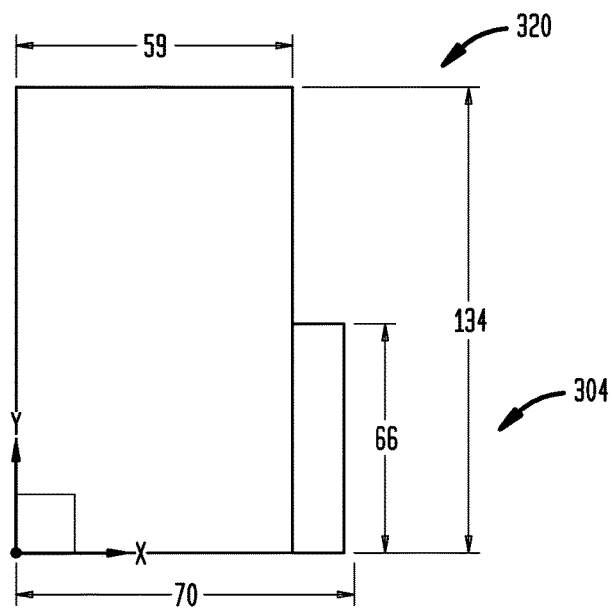

FIGS. 3A-3C illustrate examples of a sketch having sketch dimensions, a revolved modeling feature generated using the sketch, and a drawing view where the sketch dimensions are "inherited" into the drawing view.

FIGS. 3A-3B illustrate a sketch 302 that includes sketch dimensions 304 of objects. The sketch 302 is generated in a sketch plane and may be used to generate a revolved modeling feature 306. In the illustrated example of FIGS. 3A-3B, the sketch 302 was generated in a top view 314 and revolved 90 degrees about an X-axis 308.

FIG. 3C illustrates a drawing view 320 based on the top view 314 that includes the sketch dimensions 304. In this example, the top view 314 may be associated with a current view plane of the revolved modeling feature 306. The drawing view 320 is generated in a plane different from and non-parallel with the sketch plane. The sketch dimensions 304 have been "inherited" from the sketch 302 into the drawing view 320 and have an orientation parallel to an orientation of the drawing view 320. To illustrate, if one or more sketch objects are visible in the current view plane (e.g., visible from the top view 314) of the revolved modeling feature 306, then the one or more sketch objects may be generated in the drawing view 320. The drawing view 320 is generated in the current view plane and includes the sketch dimensions 304 correctly oriented (e.g., the sketch dimensions 304 of the one or more sketch objects in the drawing view 320 have an orientation parallel to an orientation of the drawing view 320). The sketch dimensions 304 of the one or more sketch objects may be correctly oriented in the drawing view 320 by rotating the sketch objects with respect to an orientation of the sketch plane based on an angle between a normal of the orientation of the sketch plane and a normal of the drawing view.

Figure 4A:
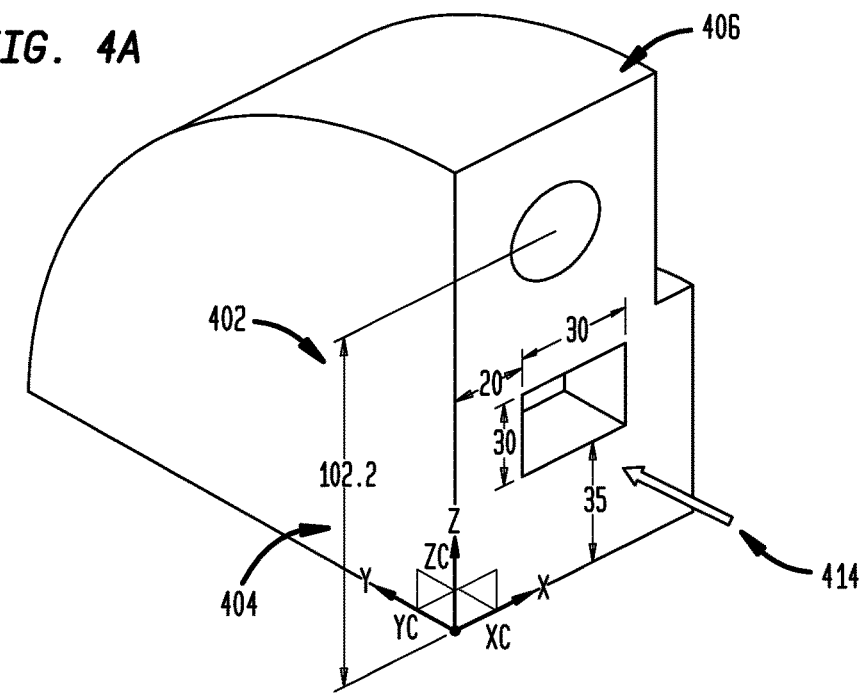
FIGS. 4A-4B illustrate other examples of a sketch having sketch dimensions, a revolved modeling feature generated using the sketch, and a drawing view where the sketch dimensions are "inherited" into the drawing view.
Figure 4B:
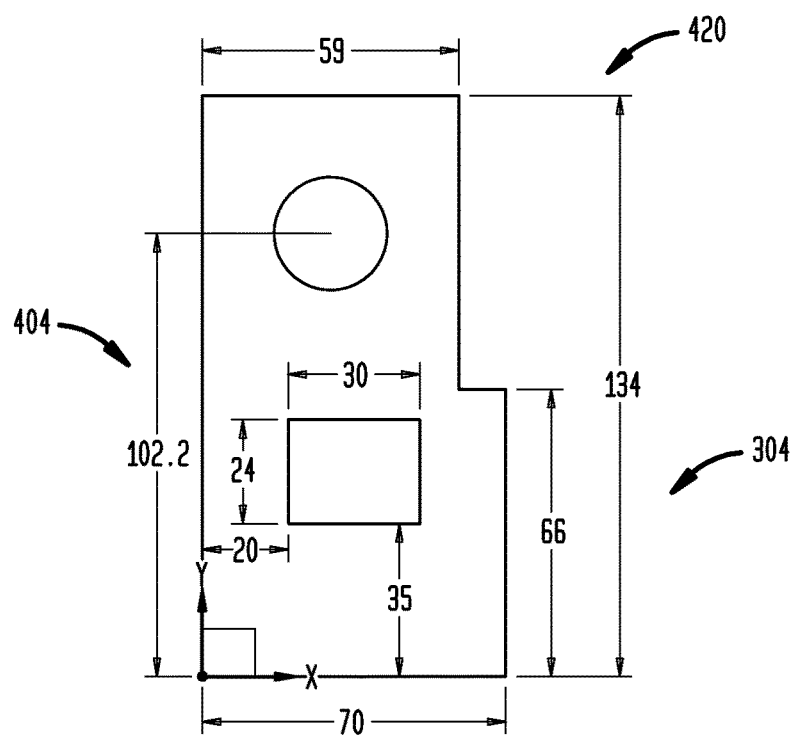

FIGS. 4A-4B illustrate other examples of a sketch having sketch dimensions, a revolved modeling feature generated using the sketch, and a drawing view where the sketch dimensions are "inherited" into the drawing view.

FIG. 4A illustrates a second sketch 402 that is generated on an end face of the revolve feature 306 of FIG. 3B in such a way that the sketch plane is perpendicular to the XY plane. If a revolve angle of the revolve feature 306 is changed from 90 degrees to 360 degrees, the plane of sketch 402 will be titled. The sketch 402 contains sketch dimension 404 of objects. In this example, the objects include a circle and a square. The sketch 402 is used to generate another revolve feature about the X axis 308 by an angle, such as a 90 degree angle, to perform a cut operation resulting in circular and rectangular pockets.

FIG. 4B illustrates a drawing view 420 that is generated based on a view direction 414 that includes the sketch dimensions 404. In this example, the view direction 414 is parallel to the normal of the drawing view 420. The sketch dimensions 404 have been inherited from the sketch 402 into the drawing view 420 and have an orientation parallel to an orientation of the drawing view 420. However, the plane of the sketch dimensions 304 of sketch 302 in FIG. 3A is not parallel to the plane of drawing view 420. Hence, the plane of the sketch dimensions 304 of sketch 302 will be rotated to the plane of the drawing view 420 so that it is appears to the plane of the drawing view 420 in correct orientation.

Figure 5A:
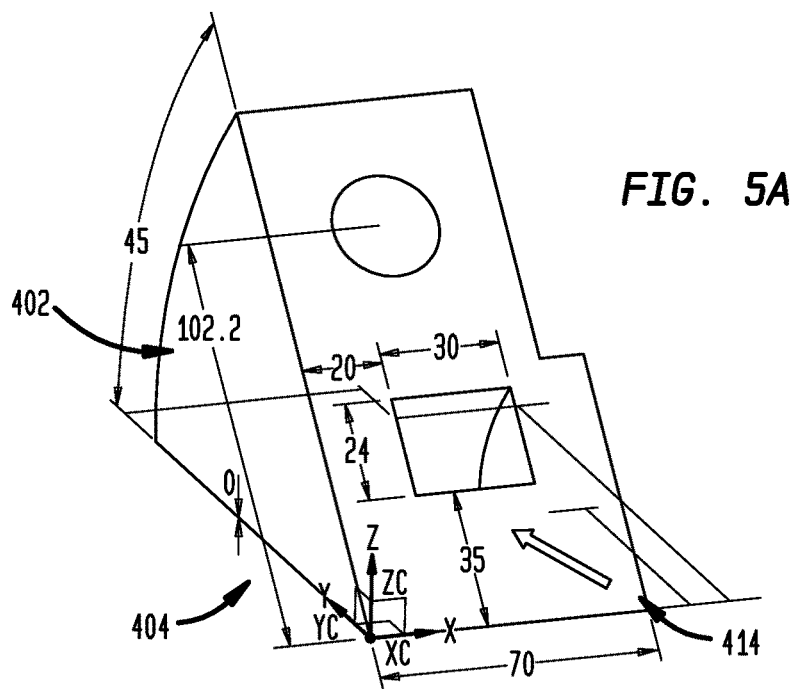
FIGS. 5A-5B illustrate other examples of a sketch having sketch dimensions, a revolved modeling feature generated using the sketch, and a drawing view where some of the sketch dimensions are not "inherited" into the drawing view due to foreshortening.

FIG. 5A illustrates the scenario when the revolve angle of the revolve feature 306 of FIG. 3B is other than 90 degrees. In this example a 45 degree revolve angle is used. This will make the plane of sketch 402 of FIG. 4A tilted and while viewing from the view direction 414 the circular pocket may appear as an elliptical shape and the sizes of the rectangular pocket may appear foreshortened.

Figure 5B:
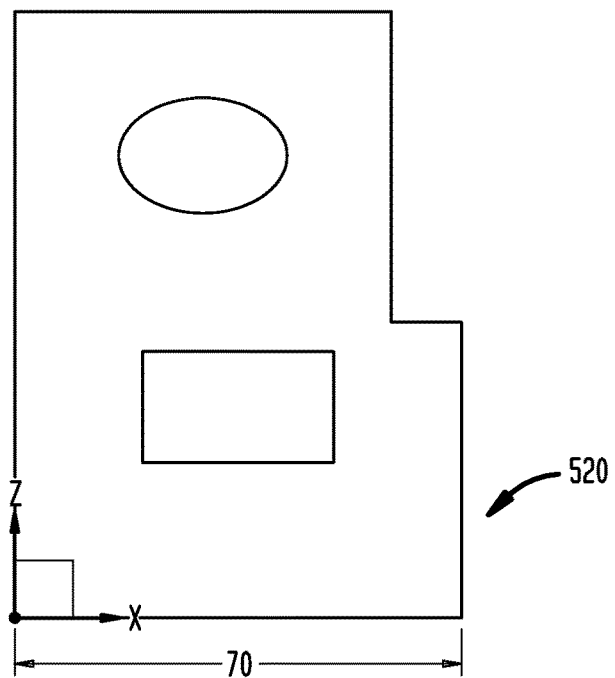

FIG. 5B illustrates a drawing view 520 similar to the drawing view 420 in FIG. 4B that is generated based on the view direction 414 of FIG. 4A. In this example, all sketch dimensions from the sketch 302 of FIG. 3A and the sketch 402 of FIG. 4A whose associative entities do not appear as true length or that are only partially visible in the drawing view 520 are removed. The rest of the sketch dimensions are shown in correct orientation.

Figure 6A:
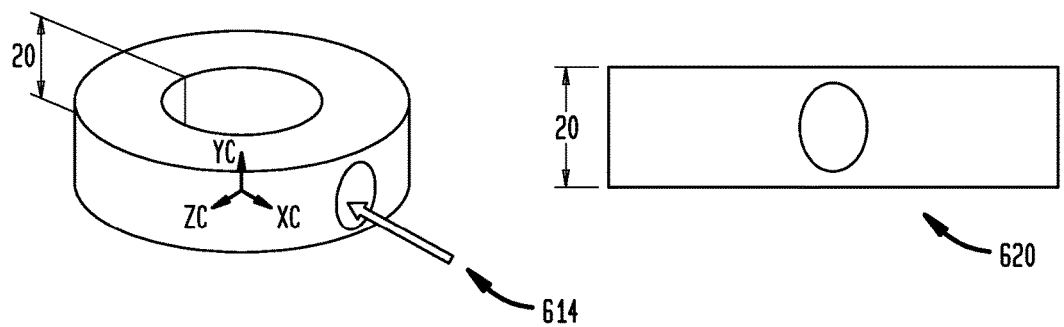
FIGS. 6A-6B illustrate examples of how inherited sketch dimensions may be oriented and located on a drawing view.
Figure 6B:
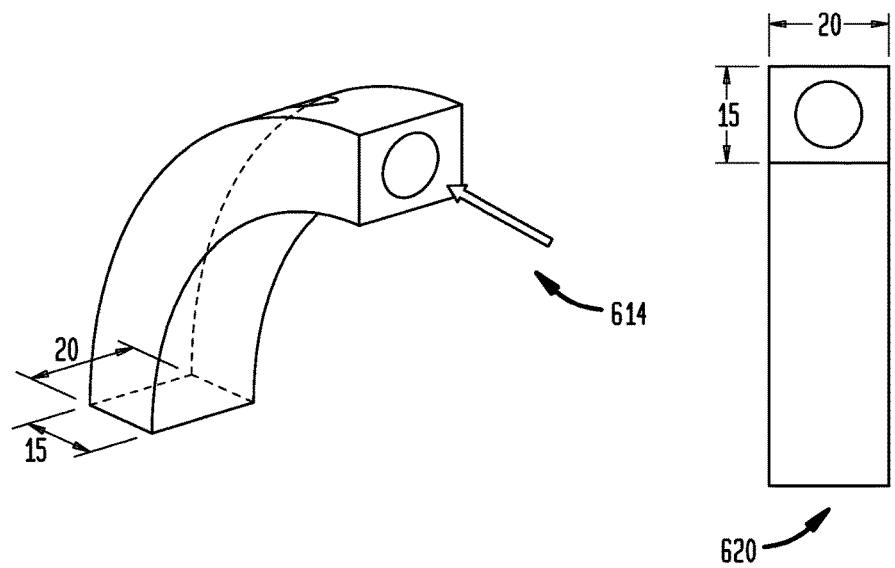

FIGS. 6A-6B illustrate examples of how inherited dimensions may be oriented and located on a drawing view. For example, as illustrated in FIG. 6A, if a sketch is revolved 360 degrees, certain view directions may yield two possible locations for the inherited sketch dimensions. In the example illustrated in FIG. 6A, a view direction 614 is such that a sketch projects as a line in a drawing view 620. In this case, the inherited sketch dimension, 20, may be generated on either a left or right side of the drawing view 620. The dimension location with respect to geometry will be maintained. Similarly, as illustrated in FIG. 6B, if a sketch is revolved less than 180 degrees, the inherited sketch dimension location with respect to geometry will be maintained.

Figure 7:
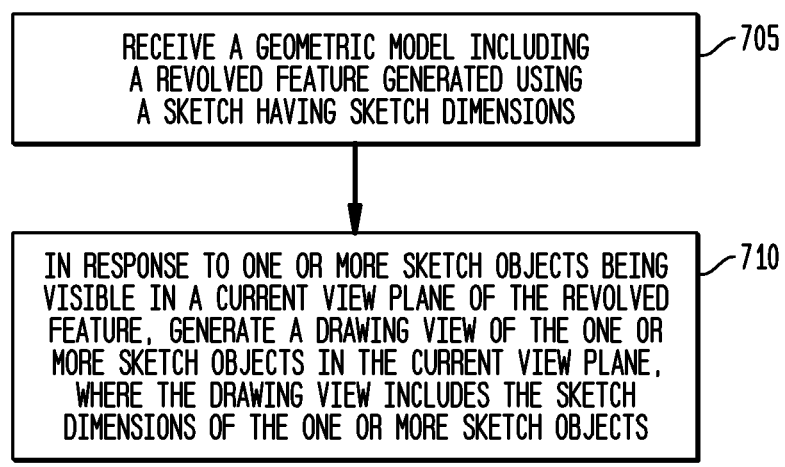
FIG. 7 illustrates a flowchart of a process in accordance with disclosed embodiments.

FIG. 7 depicts a flowchart of a process in accordance with disclosed embodiments that may be performed, for example, by a PLM or PDM system.

The system receives a geometric model including a revolved feature generated using a sketch having sketch dimensions, at step 705. The sketch and the sketch dimensions are in a sketch plane. For example, the sketch may be the sketch 302 of FIG. 3A that includes the sketch dimensions 304 or the sketch 402 of FIG. 4A that includes the sketch dimensions 404. The sketch 302 of FIG. 3A may be rotated 90 degrees about the X-axis 308 of FIG. 3A to generate the revolved modeling feature 306 of FIG. 3B. "Receiving," as used herein, can include loading from storage, receiving from another device or process, receiving via an interaction with a user, and otherwise.

In response to one or more sketch objects being visible in a current view plane of the revolved modeling feature, the system generates a drawing view of the one or more sketch objects in the current view plane, at step 710. The drawing view includes the sketch dimensions of the one or more sketch objects. For example, if one or more of the sketch objects are visible in the current view plane (e.g., visible from the top view 314 of FIG. 3A) of the revolved modeling feature 306 of FIG. 3A, then the one or more sketch objects may be generated in the drawing view 320 of FIG. 3B. The drawing view 320 is generated in the current view plane and includes the sketch dimensions 304. The sketch dimensions 304 have an orientation parallel to an orientation of the drawing view 320. Similarly, if one or more of the sketch objects are visible in the current view plane (e.g., visible from the front view 414 of FIG. 4A) of the revolved modeling feature 406 of FIG. 4A, then the one or more sketch objects may be generated in the drawing view 420 of FIG. 4. The drawing view 420 is generated in the current view plane and includes the sketch dimensions 404. The sketch dimensions 404 have an orientation parallel to an orientation of the drawing view 420.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for providing sketch dimensions for a drawing view, the method performed by a data processing system and comprising:
through operation of at least one processor:
receiving, by the data processing system, a geometric model including a revolved feature generated using a sketch having sketch objects labeled with sketch dimensions, wherein the sketch objects and the sketch dimensions are in a sketch plane;
in response to one or more sketch objects being visible in a current view plane of the revolved feature, generating and displaying through a display device of the data processing system, a drawing view of the one or more sketch objects in the current view plane, the drawing view including a first one of the sketch dimensions of the one or more sketch objects inherited from the sketch,
wherein the drawing view is generated in a plane different from and non-parallel with the sketch plane,
wherein the sketch dimensions show numeric dimension information associated with the sketch objects; and
determining that a second one of the sketch dimensions of the one or more sketch objects includes numeric dimension information that does not correspond to a true length in the plane that the drawing view is generated, and based thereon omitting the second one of the sketch dimensions from the drawing view.

2. The method of claim 1, wherein, in response to one or more of the sketch objects being determined to be foreshortened in the drawing view, removing, by the data processing system, the sketch dimensions of the foreshortened sketch objects prior to displaying the drawing view.

3. The method of claim 1, wherein the first sketch dimension inherited into the drawing view labels a dimension that is orientated parallel to the plane that the drawing view is generated, wherein the second sketch dimension omitted from the drawing view is omitted based on a determination that it labels a dimension that is not orientated parallel to the plane that the drawing view is generated.

4. The method of claim 3, wherein the orientation of the sketch dimensions of the one or more sketch objects in the drawing view are rotated with respect to an orientation of the sketch plane based on an angle between a normal of the orientation of the sketch plane and a normal of the drawing view.

5. The method of claim 1, wherein a location of the first sketch dimension in the drawing view with respect to geometry of the revolved feature is maintained.

6. A data processing system for providing sketch dimensions for a drawing view comprising:
a display device,
at least one processor; and
an accessible memory, the at least one processor of data processing system particularly configured to:
receive, by the data processing system, a geometric model including a revolved feature generated using a sketch having sketch objects labeled with sketch dimensions, wherein the sketch objects, and the sketch dimensions are in a sketch plane;
in response to one or more sketch objects being visible in a current view plane of the revolved feature, generate and display through the display device, a drawing view of the one or more sketch objects in the current view plane, the drawing view including at least one of the sketch dimensions of the one or more sketch objects inherited from the sketch,
wherein the drawing view is generated in a plane different from and non-parallel with the sketch plane,
wherein the sketch dimensions show numeric dimension information associated with the sketch objects; and
determine that a second one of the sketch dimensions of the one or more sketch objects includes numeric dimension information that does not correspond to a true length in the plane that the drawing view is generated, and based thereon omit the second one of the sketch dimensions from the drawing view.

7. The data processing system of claim 6, wherein, in response to one or more of the sketch objects being determined to be foreshortened in the drawing view, the data processing system is further configured to remove the sketch dimensions of the foreshortened sketch objects prior to displaying the drawing view.

8. The data processing system of claim 6, wherein the first sketch dimension inherited into the drawing view labels a dimension that is orientated parallel to the plane that the drawing view is generated, wherein the second sketch dimension omitted from the drawing view is omitted based on a determination that it labels a dimension that is not orientated parallel to the plane that the drawing view is generated.

9. The data processing system of claim 8, wherein the orientation of the sketch dimensions of the one or more sketch objects in the drawing view are rotated with respect to an orientation of the sketch view plane based on an angle between a normal of the orientation of the sketch view plane and a normal of the drawing view.

10. The data processing system of claim 6, wherein a location of the first sketch dimension in the drawing view with respect to geometry of the revolved feature is maintained.

11. A non-transitory computer-readable medium encoded with executable instructions that, when executed, cause at least one processor in one or more data processing systems to carry out a method for providing sketch dimensions for a drawing view comprising:

receiving a geometric model including a revolved feature generated using a sketch having sketch objects labeled with sketch dimensions, wherein the sketch objects and the sketch dimensions are in a sketch plane;

in response to one or more sketch objects being visible in a current view plane of the revolved feature, generating and displaying through a display device, a drawing view of the one or more sketch objects in the current view plane, the drawing view including at least one of the sketch dimensions of the one or sketch objects inherited from the sketch, wherein the drawing view is generated in a plane different from and non-parallel with the sketch plane, wherein the sketch dimensions show numeric dimension information associated with the sketch objects; and determining that a second one of the sketch dimensions of the one or more sketch objects includes numeric dimension information that does not correspond to a true length in the plane that the drawing view is generated, and based thereon omitting the second one of the sketch dimensions from the drawing view.

12. The computer-readable medium of claim 11, wherein, in response to one or more of the sketch objects being determined to be foreshortened in the drawing view, the data processing system is further configured to remove the sketch dimensions of the foreshortened sketch objects prior to displaying the drawing view.

13. The computer-readable medium of claim 11, wherein the first sketch dimension inherited into the drawing view labels a dimension that is orientated parallel to the plane that the drawing view is generated, wherein the second sketch dimension omitted from the drawing view is omitted based on a determination that it labels a dimension that is not orientated parallel to the plane that the drawing view is generated.

14. The computer-readable medium of claim 11, wherein the orientation of the sketch dimensions of the one or more sketch objects in the drawing view are rotated with respect to an orientation of the sketch view plane based on an angle between a normal of the orientation of the sketch view plane and a normal of the drawing view.

* * * * *